United States Patent
Lim et al.

(10) Patent No.: US 9,590,665 B2
(45) Date of Patent: Mar. 7, 2017

(54) APPARATUS AND METHOD FOR REMOVING NOISE OF POWER AMPLIFIER IN MOBILE COMMUNICATION SYSTEM

(71) Applicant: Samsung Electronics Co., Ltd., Suwon-si, Gyeonggi-do (KR)

(72) Inventors: Hyung-Sun Lim, Suwon-si (KR); Seung-Chul Lee, Yongin-si (KR); Thomas Byung-Hak Cho, Seongnam-si (KR); Ji-Seon Paek, Suwon-si (KR); Jun-Seok Yang, Seoul (KR); Jun-Hee Jung, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/723,957

(22) Filed: May 28, 2015

(65) Prior Publication Data
US 2015/0349816 A1    Dec. 3, 2015

(30) Foreign Application Priority Data

May 28, 2014    (KR) .................. 10-2014-0064498

(51) Int. Cl.
| | |
|---|---|
| *H04K 1/02* | (2006.01) |
| *H04B 1/04* | (2006.01) |
| *H03F 3/19* | (2006.01) |
| *H03F 3/24* | (2006.01) |

(Continued)

(52) U.S. Cl.
CPC ......... *H04B 1/0475* (2013.01); *H03F 1/0227* (2013.01); *H03F 3/19* (2013.01); *H03F 3/217* (2013.01); *H03F 3/245* (2013.01); *H03F 2200/102* (2013.01); *H03F 2200/111* (2013.01); *H03F 2200/336* (2013.01); *H03F 2200/432* (2013.01); *H03F 2200/451* (2013.01); *H03F 2200/555* (2013.01); *H04B 2001/0408* (2013.01)

(58) Field of Classification Search
CPC ..................................................... H04B 1/0475
USPC ............................................................ 375/297
See application file for complete search history.

(56) References Cited

U.S. PATENT DOCUMENTS

| | | | |
|---|---|---|---|
| 6,792,252 B2 * | 9/2004 | Kimball ............... | H03F 1/3223 330/251 |
| 2002/0008574 A1 * | 1/2002 | Mathe .................. | H03F 1/0222 330/10 |

(Continued)

OTHER PUBLICATIONS

Jeff Barrow, Understand and reduce dc/dc-switching-converter ground noise, Integrated Device Technology Inc—Apr. 5, 2012.

*Primary Examiner* — Lihong Yu
(74) *Attorney, Agent, or Firm* — Jefferson IP Law, LLP

(57) ABSTRACT

A transmitter in a wireless communication system is provided. The transmitter includes a baseband signal processor for detecting an envelope signal, a supply modulator (SM) for producing power to be supplied to a power amplifier using the detected envelope signal, and the power amplifier for receiving voltage from the SM and for amplifying power of a transmit signal. The SM generates a compensation signal corresponding to switching noise generated via switching amplification, and adds the compensation signal and the switching noise. The amplifier of the wireless communication system can produce low switching noise, and the envelope tracking power amplifier can prevent reception degradation due to the noise of the supply modulator.

26 Claims, 11 Drawing Sheets

(51) Int. Cl.
*H03F 1/02* (2006.01)
*H03F 3/217* (2006.01)

(56) References Cited

U.S. PATENT DOCUMENTS

| | | |
|---|---|---|
| 2006/0280314 A1* | 12/2006 | Okada ................... H03F 3/217 |
| | | 381/71.1 |
| 2011/0181119 A1* | 7/2011 | Ishibashi ................ H02J 5/005 |
| | | 307/104 |
| 2011/0193629 A1 | 8/2011 | Hou et al. |
| 2012/0269240 A1 | 10/2012 | Balteanu et al. |
| 2013/0093521 A1 | 4/2013 | Paek et al. |
| 2013/0109442 A1 | 5/2013 | Dakshinamurthy et al. |
| 2013/0169245 A1 | 7/2013 | Kay et al. |
| 2014/0028370 A1 | 1/2014 | Wimpenny |

\* cited by examiner

APPARATUS AND METHOD FOR REMOVING NOISE OF POWER AMPLIFIER IN MOBILE COMMUNICATION SYSTEM

CROSS-REFERENCE TO RELATED APPLICATION(S)

The application claims the benefit under 35 U.S.C. §119(a) of a Korean patent application filed on May 28, 2014 in the Korean Intellectual Property Office and assigned Serial number 10-2014-0064498, the entire disclosure of which is hereby incorporated by reference.

TECHNICAL FIELD

The present disclosure relates to an apparatus and a method for reducing output noise of a power amplifier to enhance power efficiency through the power amplifier of a transmitter.

BACKGROUND

As a wireless communication service is centered on data transmission, a transmitter and a receiver process a high Peak to Average Power Ratio (PAPR) and broadband data with high efficiency and high linearity. In a Frequency Division Duplex (FDD) system that transmits and receives data at the same time, noise of a power amplifier can flow into a receive frequency band and thus degrade reception. Hence, low output noise of the power amplifier is desired in a receive band (RX band noise). For doing so, a current common power amplifier (e.g., a single amplifier or a multi-mode multi-band amplifier) obtains linearity through an efficient back-off using a fixed power supply. The current common power amplifier operates in a back-off region. Accordingly, the power noise does not affect the output of the power amplifier owing to a gain of low voltage variation (hereafter, referred to as a VcctoRF gain) or a high Power Supply Rejection Ratio (PSRR).

However, a related-art method using the fixed power supply operates in the back-off region and emits heat from a high supply voltage even when the output signal is weak, thus limiting efficiency. To address this, an envelope tracking power amplifier can be used. Envelope tracking power amplification can achieve high efficiency by changing a supply voltage according to the output power and ultimately reducing power loss in the power amplifier operation.

FIG. 1 illustrates an envelope tracking power amplifier according to the related art. Referring to FIG. 1, the envelope tracking power amplifier includes a baseband signal processor 110, a supply modulator (SM) 120, a Radio Frequency (RF) processor 130, and a power amplifier 140. The baseband signal processor 110 generates, up-converts, and outputs IQ data in an RF frequency. The SM 120 receives a signal from the baseband signal processor 110 and outputs the same envelope as an input envelope. The RF processor 130 converts the IQ data fed from the baseband signal processor 110 to an RF signal and provides the RF signal as an input signal of the power amplifier 140. The power amplifier 140 amplifies and outputs the input signal fed from the RF processor 130 using the supply voltage from the SM 120.

The envelope tracking power amplifier separates an envelope component of the signal applied to the input and then changes the amplifier supply voltage by tracking the component. Since the envelope power amplifier operates in every instantaneous saturation region compared to a general power amplifier applying a constant supply voltage, the envelope power amplifier can achieve high efficiency.

An SM supplies the power to the power amplifier according to the envelope. Since the envelope tracking power amplification operates the amplifier in the saturation region to raise the efficiency, the VcctoRF gain characteristic of the power amplifier increases compared to the related-art fixed voltage. That is, in the envelope tracking power amplifier, not only the noise of the power amplifier but also the noise of the SM affect the output.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure to provide an apparatus and a method for enhancing an efficiency of a power amplifier in a transmitter.

Another aspect of the present disclosure is to provide an apparatus and a method for removing noise in a transmitter.

Another aspect of the present disclosure is to provide an apparatus and a method of a supply modulator (SM) having a low noise level.

Another aspect of the present disclosure is to provide an apparatus and a method for selectively removing noise of a receive band according to a frequency band used.

In accordance with an aspect of the present disclosure, a transmitter in a wireless communication system is provided. The transmitter includes a baseband signal processor for detecting an envelope signal, a SM for producing power to be supplied to a power amplifier using the detected envelope signal, and the power amplifier for receiving voltage from the SM and for amplifying power of a transmit signal, wherein the SM generates a compensation signal corresponding to switching noise generated via switching amplification, and adds the compensation signal and the switching noise.

In accordance with another aspect of the present disclosure, a transmitting method in a wireless communication system is provided. The method includes detecting an envelope signal of a transmit signal, producing a supply of power for power amplification of the transmit signal using the detected envelope signal, and amplifying power of the transmit signal according to the supply of power, wherein the producing of the supply of power includes generating a compensation signal corresponding to a switching noise generated via switching amplification, and adding the compensation signal and the switching noise.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components and structures.

DETAILED DESCRIPTION

Figure 1:
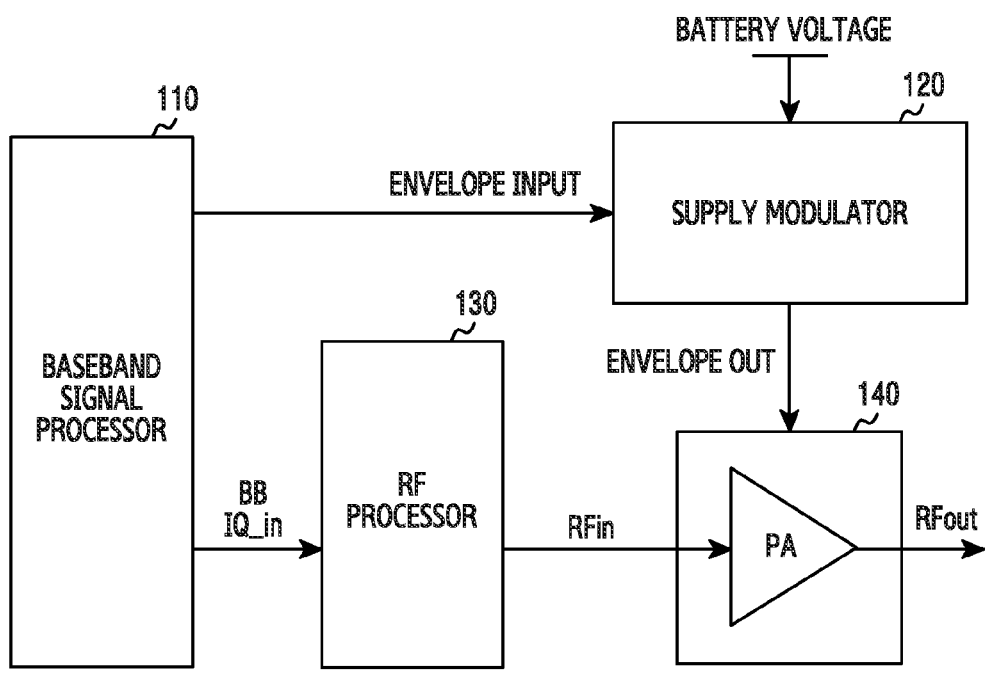
FIG. 1 illustrates an envelope tracking power amplifier according to the related art.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Various embodiments of the present disclosure provide a technique for removing noise in a transmitter.

A supply modulator (SM) features high efficiency and applies a broadband envelope signal to a power amplifier at a low noise level without distortion. To meet those two requirements, a SM having a Hybrid Switching Amplifier (HAS) structure is actively studied. The hybrid SM uses both a linear amplifier and a switching amplifier since most of the power exists at low frequencies and the low power exists at high frequencies in an envelope of a modulation signal for general mobile communication or a spectrum of amplitude information. The linear amplifier features a wide bandwidth and a linear operation but suffers from low efficiency, whereas the switching amplifier features a switching operation and high efficiency even with a narrow bandwidth. Ultimately, the hybrid SM can linearly send the input signal to the output with high efficiency such that the switching amplifier having high efficiency supplies most of the current required for an output load and the linear amplifier of low efficiency compensates for deficient or excessive current.

Typically, the linear amplifier includes an Operational (OP) amplifier and conducts a push-pull operation at a class AB bias, and the switching amplifier includes a buck converter and conducts the switching operation. In so doing, the current supplied from the linear amplifier to the output load is detected, and thus a switching state of the buck converter is determined based on a magnitude and a polarity of the detected current.

A related-art method using the fixed supply voltage operates in a back-off region and cannot achieve high efficiency, but its VcctoRF gain is low. Hence, noise of the power supply can be suppressed enough in the output.

Figure 2:
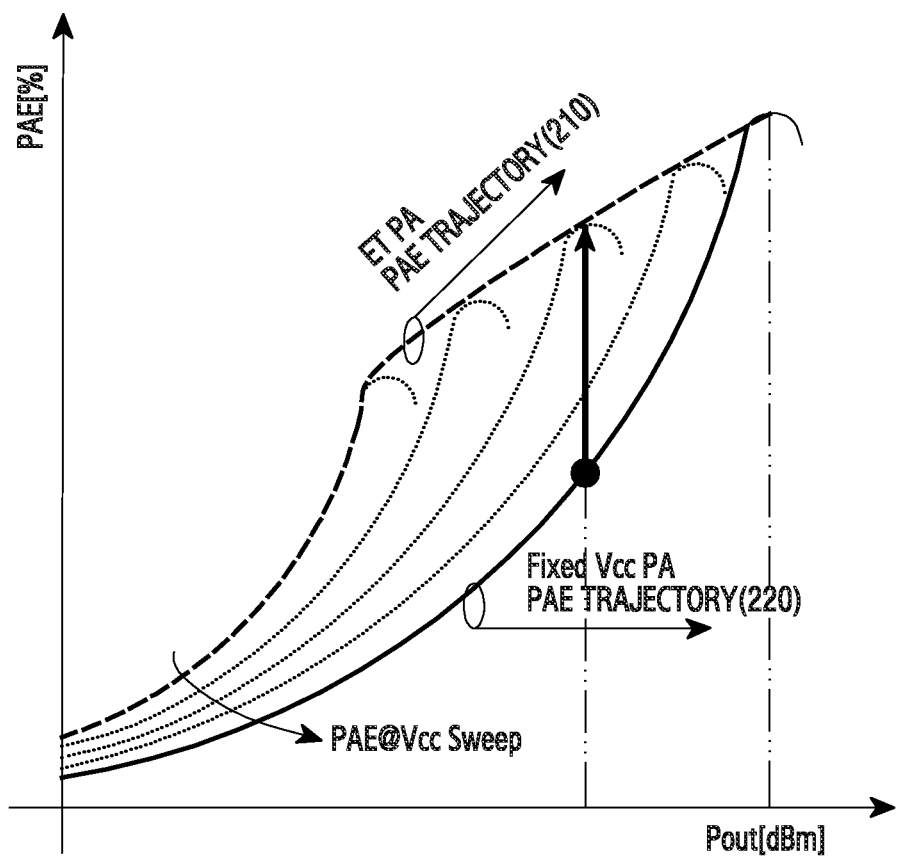
FIG. 2 illustrates an efficiency according to an output power of a fixed voltage amplifier and an envelope amplifier according to an embodiment of the present disclosure.

FIG. 2 illustrates an efficiency according to an output power of a fixed voltage amplifier and an envelope amplifier according to an embodiment of the present disclosure. Related-art amplification 220 using the fixed supply voltage exhibits low efficiency because it backs off for a high P1 dB so as to meet the linearity at a target output voltage. Accordingly, the VcctoRF gain is also quite low. By contrast, amplification 210 using the envelope tracking exhibits higher efficiency than the fixed supply voltage.

Figure 3:
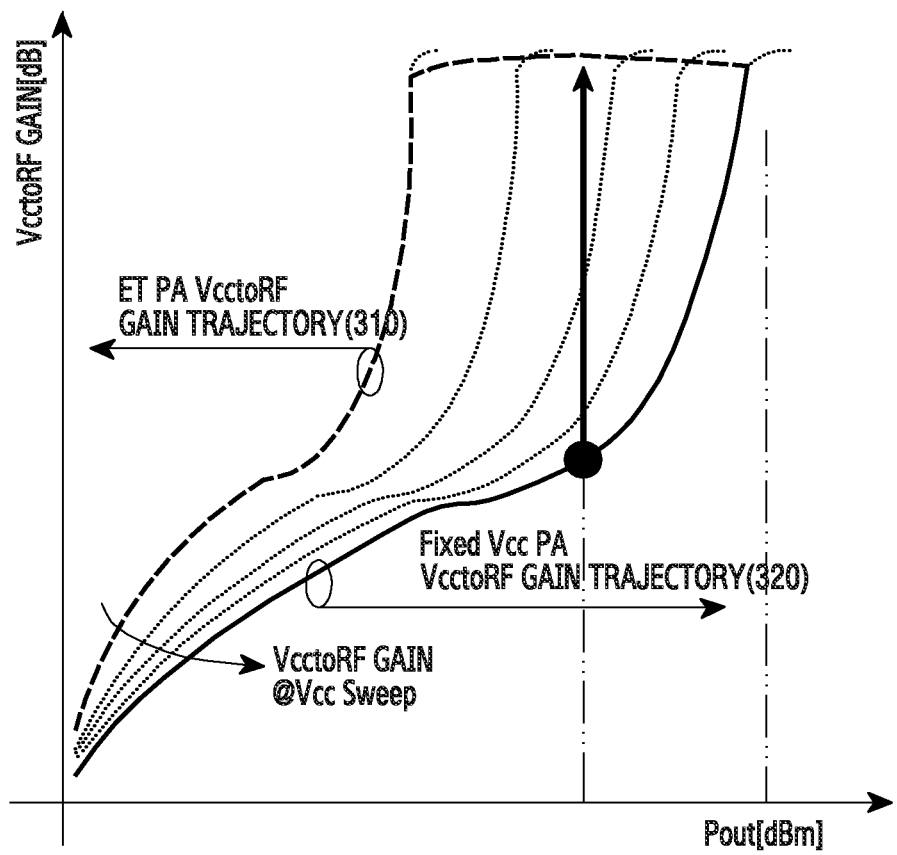
FIG. 3 illustrates a VcctoRF gain according to an output power of a fixed voltage amplifier and an envelope amplifier according to an embodiment of the present disclosure.

FIG. 3 illustrates a VcctoRF gain according to an output power of a fixed voltage amplifier and an envelope amplifier according to an embodiment of the present disclosure. Amplification 310 using the envelope tracking can increase efficiency in a wider power range than related-art amplification using a fixed power voltage 320. However, since the power amplifier operates in a saturation region, the VcctoRF gain is maintained at a high value. That is, the envelope tracking power amplification can enhance the efficiency by operating the power amplifier in the saturation region so as to overcome the low efficiency of the related-art power amplifier using the fixed supply voltage. However, considerable noise of the power supply due to the very high VcctoRF gain affects the output of the power amplifier and thus degrades the reception.

The hybrid SM produces less switching noise than the switching SM, but cannot completely remove the noise of the switching amplifier of the high frequency component because of the limited bandwidth of the linear amplifier. The switching noise of the switching power supply is coupled as the output through a parasitic capacitor of a power inductor. The parasitic capacitor indicates capacitance produced by the inductor itself, rather than installed by a user. A basic operation of the switching power supply generates an intended voltage for the output through the switching and LC filtering. However, the inductor has a parasitic capacitance and the noise of a higher frequency band than a resonance frequency is coupled to a parasitic capacitor.

To reduce the parasitic capacitance of the inductor, a power inductor can be connected in series. Two inductors each have ½ L for the same inductance and each have ½ Cp because the parasitic capacitance of the inductor is mostly in proportion to the inductance. Finally, the total parasitic capacitance is ¼ Cp and the resonance frequency is raised, thus suppressing noise in a frequency band of interest. Disadvantageously, the multiple inductors increase an area and a cost (e.g., a size of one power inductor is similar to or greater than a size of a chip of the switching power supply).

Figure 4:
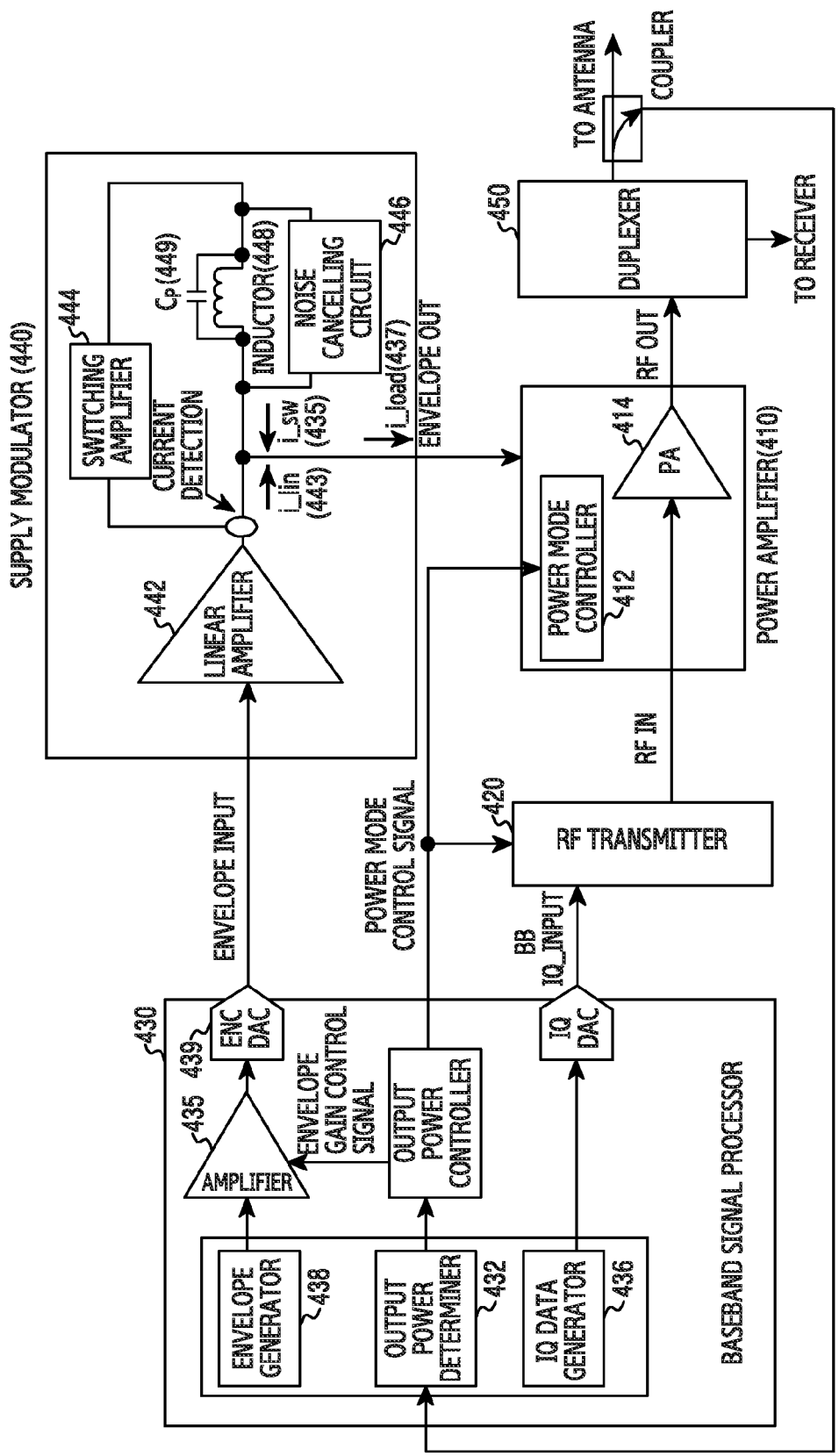
FIG. 4 illustrates an envelope tracking power amplifier using a supply modulator (SM) according to an embodiment of the present disclosure.

FIG. 4 illustrates an envelope tracking power amplifier using a SM according to an embodiment of the present disclosure.

Referring to FIG. 4, a transmitter includes a power amplifier 410, a Radio Frequency (RF) transmitter 420, a baseband signal processor 430, and a SM 440.

The transmitter can amplify a signal using the power amplifier 410. The power amplifier 410 includes a power mode controller 412 and an amplifier 414. The power amplifier 410 can support a single frequency band or all of different communication mode (e.g., 2G, 3G, and 4G) frequencies or different frequency bands. To apply the envelope tracking to any case, the power amplifier 410 receives an RF input signal and a synchronized envelope signal from the SM 440, and amplifies the RF signal fed from the RF transmitter 420 through the amplifier 414 according to a power mode control signal of the power mode controller 412.

The RF transmitter 420 converts IQ data fed from an IQ data generator 436, to an RF signal according to an RF gain control signal from the baseband signal processor 430.

The transmitter detects the envelope using the baseband signal processor 430. An output power determiner 432 combines a transmit signal input and a finally amplified output power and outputs an output power level of the corresponding transmit signal. The IQ data generator 436 generates baseband IQ data meeting a communication standard. The IQ data is up-converted to an RF frequency through an IQ Digital to Analog Converter (DAC) 437 and the RF transmitter 420 and applied as an input signal of the power amplifier 410. The IQ DAC 437 converts the IQ data generated by the IQ data generator 436 to an analog signal. An envelope generator 438 generates an envelope signal corresponding to the IQ data generated by the IQ data generator 436 and sends the envelope signal to the amplifier 435. An output power controller 434 generates an envelope gain control signal, an RF gain control signal, and a power mode control signal according to the output power level of the transmit signal output from the output power determiner 432. For example, the power controller 434 generates a gain control signal according to the output power level of the transmit signal determined by the output power determiner 432 and provides the gain control signal to the RF transmitter 420 and the amplifier 435. The amplifier 435 amplifies the signal and provides the amplified signal to an ENC DAC 439. The ENC DAC 439 converts the amplified envelope signal to an analog signal and output the analog signal to the SM 440.

The transmitter receives the signal through the SM 440, maintains high efficiency and linearity, and outputs the same envelope signal as the input envelope signal. A basic operation principle of the SM 440 is the same as the operation principle of the hybrid supply modulator. The SM 440 determines the supply voltage of the power amplifier 410 according to the envelope signal fed from the baseband signal processor 430. The SM 440 includes a linear amplifier 442, a switching amplifier 444, a noise cancelling circuit 446, and a power inductor 448.

The linear amplifier 442 includes an OP amplifier, conducts the push-pull at a class AB bias, amplifies the envelope signal fed from the baseband signal processor 430, and outputs current i_lin 443. The switching amplifier 444 detects current supplied from the linear amplifier 442 to the output load, determines the output according to the magnitude and the polarity of the detected current, and supplies current to the output load of the SM 440. The switching amplifier 444 includes a buck converter and conducts the switching operation. The SM 440 includes the power inductor 448 for suppressing an abrupt change of the current supplied from the switching amplifier 444 and generating an intended voltage for the output.

When the power inductor 448 is installed, a physical effect of the circuit can generate a parasitic capacitance 449. The parasitic capacitance 449 generated by the power inductor 448, rather than the actual device, is depicted in FIG. 4. The generated parasitic capacitance 449 can be coupled with the switching noise generated by the voltage variation in the switching operation of the switching amplifier 444 to supply the current according to the envelope signal. The power inductor 448 functions to suppress the abrupt current change by inducing the voltage in proportion to the current change. When the parasitic capacitance 449 arises, part of the supplied signal may not respond to the current change due to the influence of the parasitic capacitance 449. Hence, the switching noise can be coupled with the parasitic capacitance 449 and exhibited in the output, thus affecting a performance of the envelope tracking amplifier.

To address the effect on the performance of the envelope tracking amplifier, the present disclosure provides a method for reducing the noise. The present disclosure can employ a noise cancelling circuit 446 to remove the switching noise. The noise cancelling circuit 446 is connected to the power inductor 448 in parallel so as to remove the switching noise coupled with the parasitic capacitance 449 generated by the power inductor 448. The noise cancelling circuit 446 connected in parallel can cancel and remove the noise. More specifically, the switching noise is removed by adding with an in-phase or anti-phase compensation signal of the switching noise generated from the noise cancelling circuit 446. Ultimately, the signal produced by coupling the switching noise generated by the switching amplifier 444 with the parasitic capacitance 449 is added with the noise cancelling circuit 446 and output as an i_sw signal 445 in FIG. 4. The output i_sw signal 445 is added with the i_lin 443 of FIG. 4 generated from the linear amplifier and finally output as an i_load signal 447.

A duplexer 450 links transmit and receive antennas. Since a Frequency Division Duplex (FDD) system conducts the transmission and the reception at the same time, the duplexer 450 divides the transmission and the reception.

Figure 5:
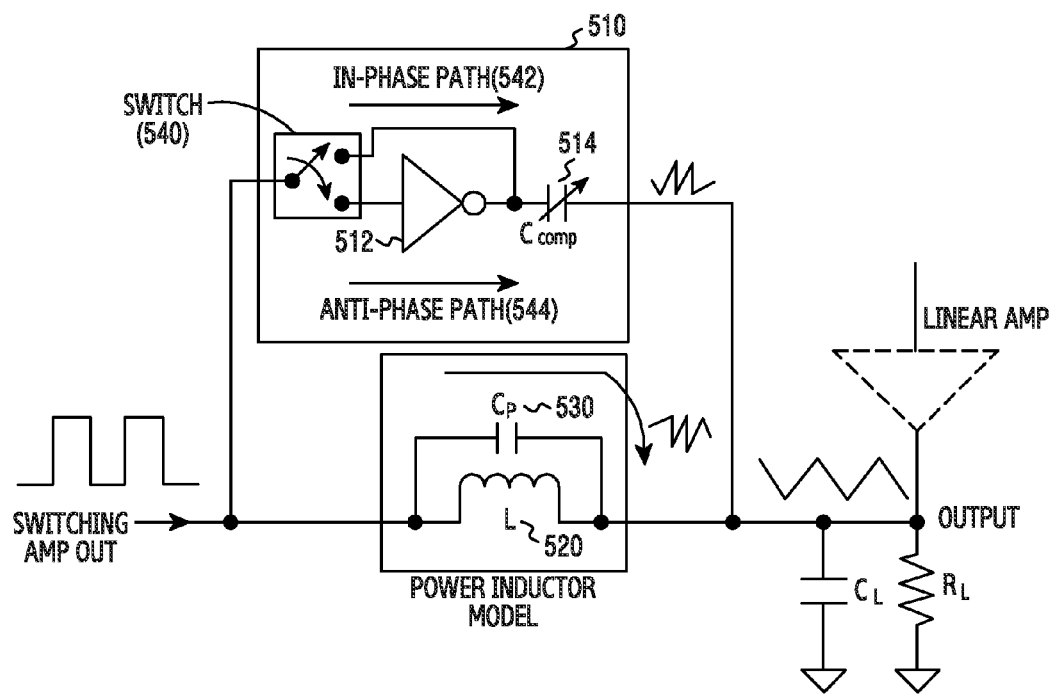
FIG. 5 illustrates a SM including a noise cancelling circuit according to an embodiment of the present disclosure.

FIG. 5 illustrates a SM including a noise cancelling circuit according to an embodiment of the present disclosure.

The noise cancelling circuit 510 includes an inverter 512, a compensation capacitor 514, and a phase switch 540. The phase switch 540 determines a phase of the compensation signal. The phase switch 540 determines a path of the compensation signal using a path determination signal.

To generate the path determination signal, for example, the baseband signal processor 430 compares a carrier signal with a preset threshold. When the carrier signal exceeds the threshold, the baseband signal processor 430 generates a path determination signal for connecting the phase switch to an anti-phase path 544. In contrast, when the frequency band signal of interest falls below the threshold, the baseband signal processor 430 generates a path determination signal for connecting the phase switch to an in-phase path 542. The path determination signal can be determined by a control block other than the baseband signal processor 430.

When the phase switch selects the anti-phase path 544 for cancelling the noise of the higher frequency band than the threshold, a switching amp output signal becomes out of phase through the inverter 512 and the compensation capacitor 514 compensates for the capacitance to the same value as the parasitic capacitance 530 of power inductor 520. That is, in the high frequency band, the noise cancelling circuit 510 passes the switching amp output signal in the anti-phase path 544 and generates a compensation signal having the same capacitance as the noise combined with the parasitic capacitance 530 and the opposite phase. The generated compensation signal is added with the noise signal of the parasitic capacitance 530, to thus cancel the noise.

When the phase switch selects the in-phase switch 542 for cancelling the noise of the lower frequency band than the threshold, a switching amp output signal bypasses without the inverter 512 and does not change the phase, and the compensation capacitor 514 compensates for the capacitance. In so doing, unlike the noise cancellation of the high frequency band, the compensation capacitor 514 does not always compensate for the capacitance with the same value as the parasitic capacitance 530. In the low frequency band, resonance of the parasitic capacitance 530 causes less switching noise. The capacitance for compensating for the high frequency band signal is determined and preset through an experiment. Since the capacitance has the same phase as the parasitic capacitance 530, the parasitic capacitance increases and the resonance of the parasitic capacitance reduces the switching noise, compared to the low frequency band signal processing.

Figure 6:
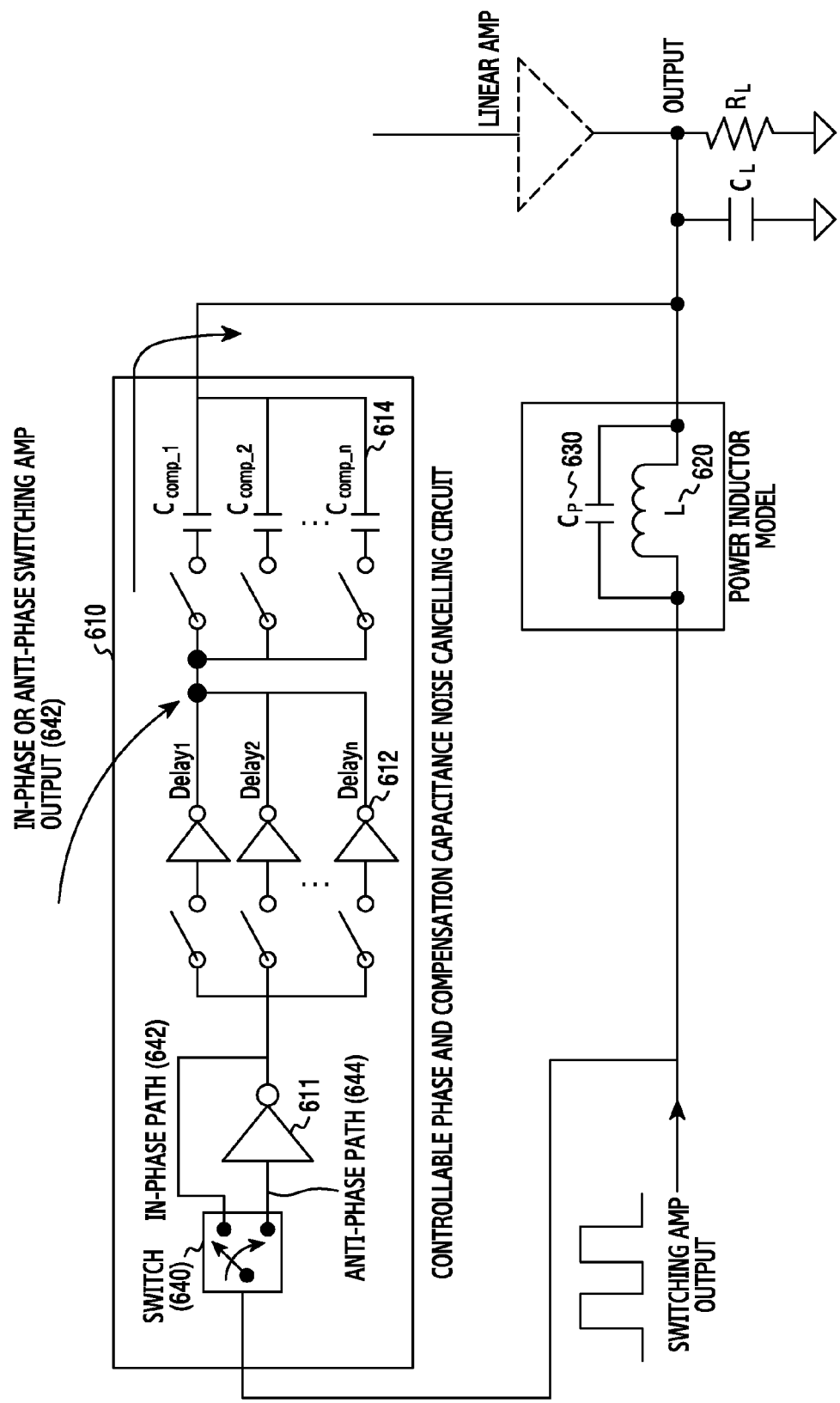
FIG. 6 illustrates a SM including a noise cancelling circuit, a controllable phase regulator, and a capacitance compensator according to an embodiment of the present disclosure.

FIG. 6 illustrates a SM including a noise cancelling circuit, a controllable phase regulator, and a capacitance compensator according to an embodiment of the present disclosure.

The noise cancelling circuit 610 includes an inverter 611 and a phase switch 540. The phase switch 540 determines a phase of the compensation signal. The phase switch 540 determines a path of the compensation signal using a path determination signal. To generate the path determination signal, for example, the baseband signal processor 430 compares a carrier signal with a preset threshold. When the carrier signal exceeds the threshold, the baseband signal processor 430 generates a path determination signal for connecting the phase switch to an anti-phase path 644. In contrast, when the frequency band signal of interest falls below the threshold, the baseband signal processor 430 generates a path determination signal for connecting the phase switch to an in-phase path 642. The path determination signal can be determined by a control block other than the baseband signal processor 430.

To completely remove noise in a high frequency band, the noise cancelling circuit 610 needs to accurately generate the anti-phase of an input signal of a power inductor 620, and to use a compensation capacitance matching a parasitic capacitance 630 of the power inductor 620. For doing so, a noise reduction level is compensated using a plurality of phase regulators 612 and compensation capacitors 614 under digital control.

To remove noise in a low frequency band, an adequate compensation capacitance is used and added to a parasitic capacitance 630. To add the adequate compensation capacitance to the parasitic capacitance 630, an optimum value can be preset through an experiment.

The digital control is feasible using an electronic or physical switch, the switch is turned on/off according to a calibration signal, and thus a signal path is established. The path can be set using a method of obtaining and inputting an optimum calibration value for removing the noise through repetitive experiments, a method of receiving and setting a calibration signal from the baseband signal processor through a Serial Peripheral Interface (SPI), or a method of switching on only a particular inverter and a particular parasitic capacitor for the optimal noise removal among the multiple inverters and compensation capacitors and switching off the other switches.

Figure 7:
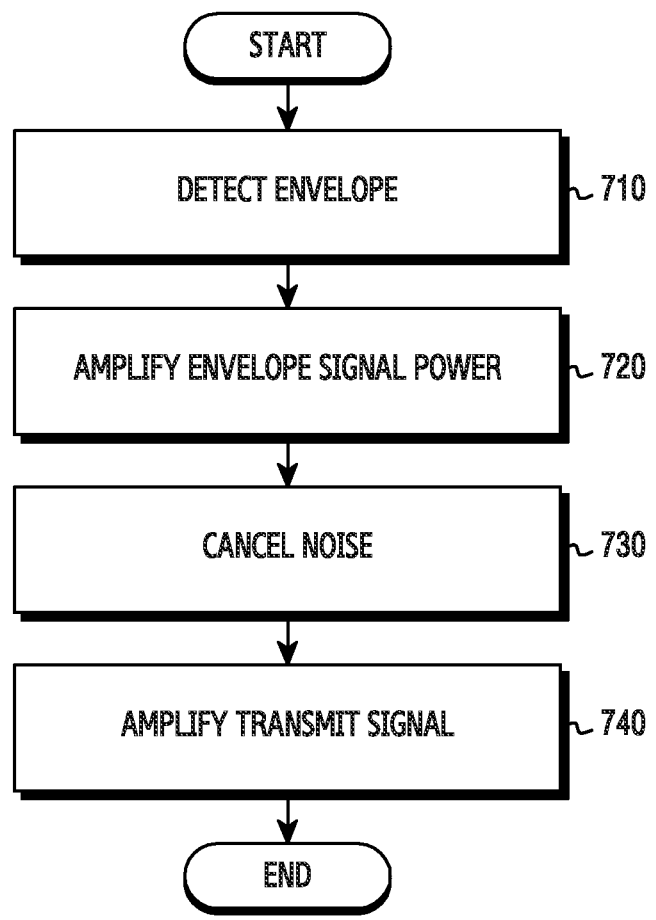
FIG. 7 illustrates a method for amplifying a signal of a transmitter according to an embodiment of the present disclosure.

FIG. 7 illustrates a method for amplifying a signal of a transmitter according to an embodiment of the present disclosure.

Referring to FIG. 7, the transmitter detects an envelope of a transmit signal in operation 710. For example, the envelope generator 438 of the baseband signal processor 430 generates the envelope signal corresponding to the IQ data generated by the IQ data generator 436

In operation 720, the transmitter amplifies the power of the envelope. The transmitter identifies and amplifies the envelope of the transmit signal.

In operation 730, the transmitter cancels the noise. To maintain the high efficiency and linearity, the transmitter can remove the switching noise. More specifically, for the noise cancellation, to minimize noise of a frequency offset of a receive band according to a used frequency band, the transmitter selects an opposite phase in a high frequency band and cancels the noise using the same compensation capacitance as the parasitic capacitance. In a low frequency band, the transmitter selects the in-phase, selects a preset optimum compensation capacitance, and thus cancels the noise. For doing so, the transmitter can include the noise cancelling circuit, and the noise cancelling circuit can include the plurality of the phase regulators and the plurality of the compensation capacitors.

In operation 740, the transmitter amplifies the signal. For example, the transmitter amplifies and sends the power of the transmit signal using the voltage supplied from the SM 440. The power amplifier 410 amplifies and outputs the power of the RF signal fed from the RF transmitter 420 using the voltage supplied from the SM 440.

FIG. 8 illustrates a model for simulating a frequency characteristic according to an embodiment of the present disclosure.

Figure 8A:
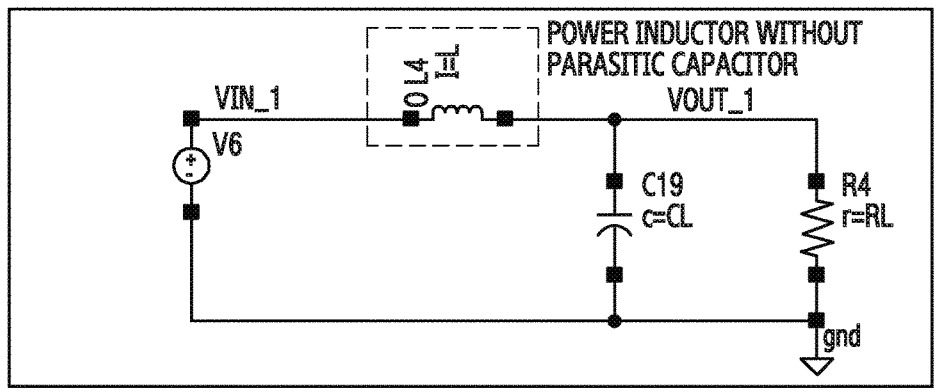
FIGS. 8A, 8B, and 8C illustrate a model for simulating a frequency characteristic according to an embodiment of the present disclosure.
Figure 8B:
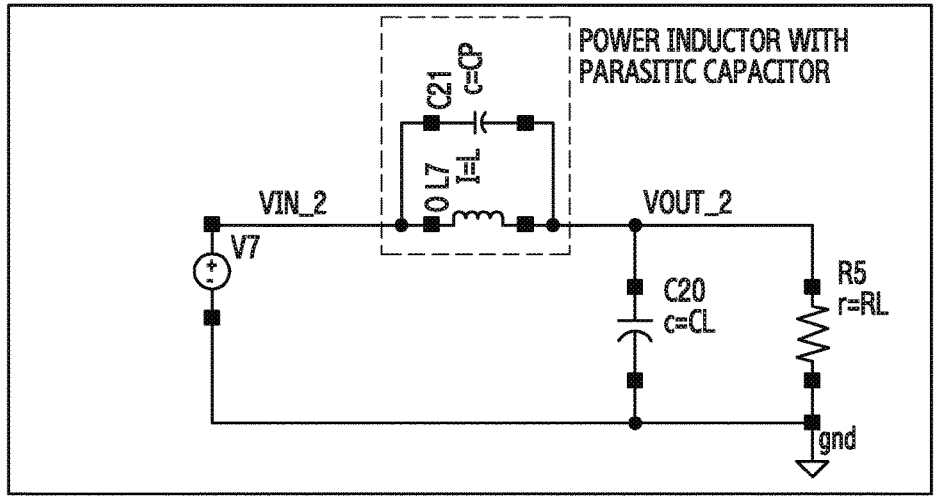
Figure 8C:
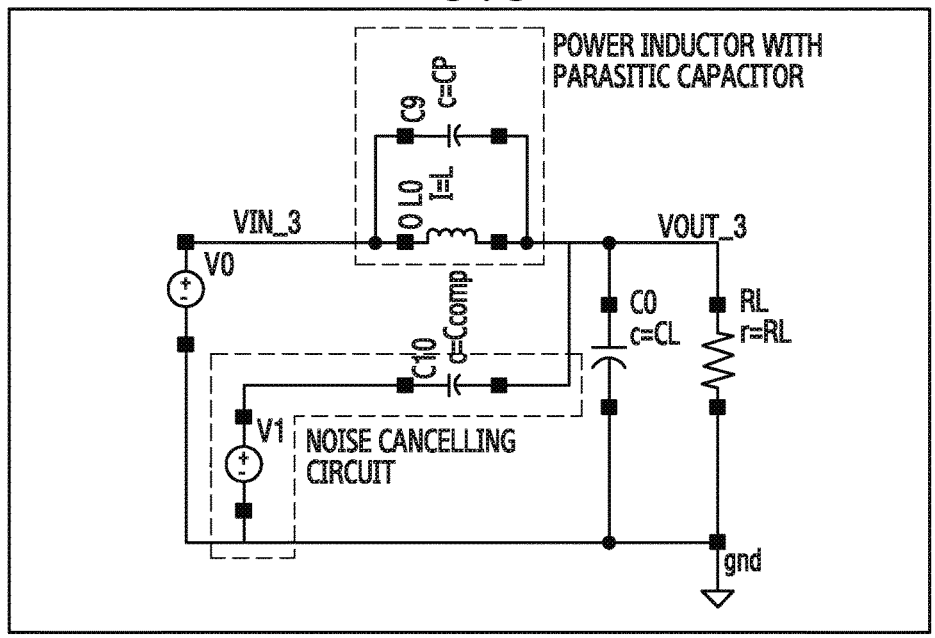

The model of FIG. 8 can suppress noise coupled to the parasitic capacitor of the power inductor through the noise cancellation. FIG. 8A depicts an ideal case without a parasitic capacitor of the power inductor, FIG. 8B takes into account a parasitic capacitor, and FIG. 8C includes the present noise cancelling circuit. The noise cancelling circuit conceptually includes a source having the anti-phase or in-phase with the signal input to the power inductor, and a compensation capacitor.

FIG. 9 illustrates frequency characteristic simulation results according to an embodiment of the present disclosure.

Figure 9A:
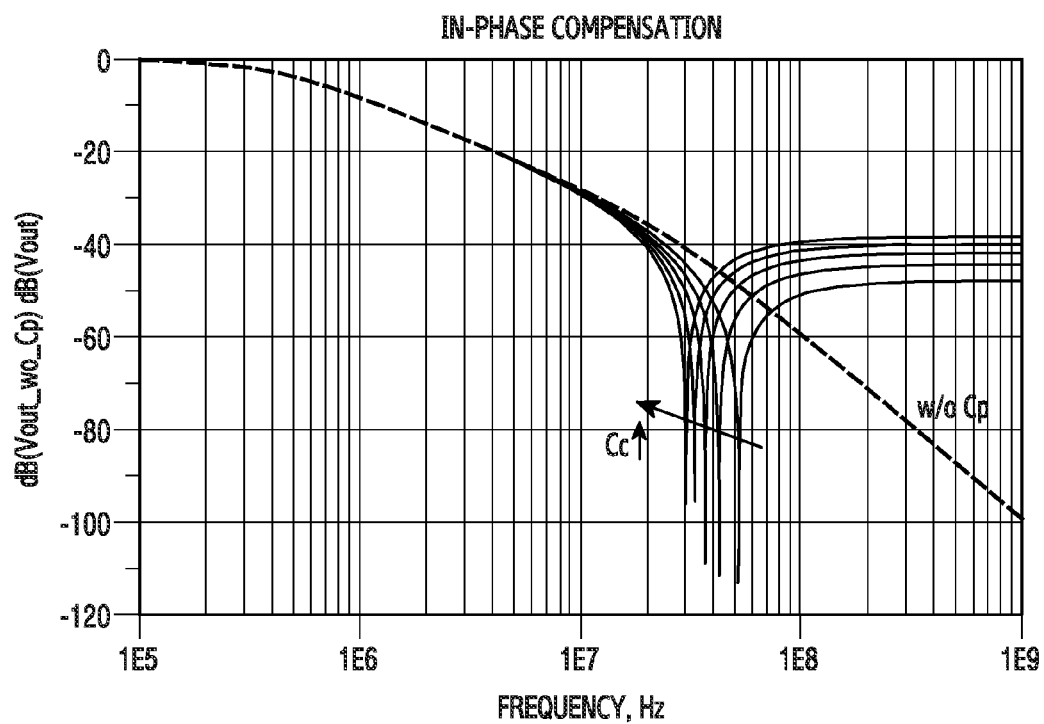
FIGS. 9A and 9B illustrate frequency characteristic simulation results according to an embodiment of the present disclosure.

Referring to FIG. 9A, the compensation capacitance is changed with the in-phase of the switching noise. In the in-phase, as the compensation capacitance increases, the value can be added with the parasitic capacitance and thus a resonance point falls. That is, the noise of the low frequency band can be suppressed.

Figure 9B:
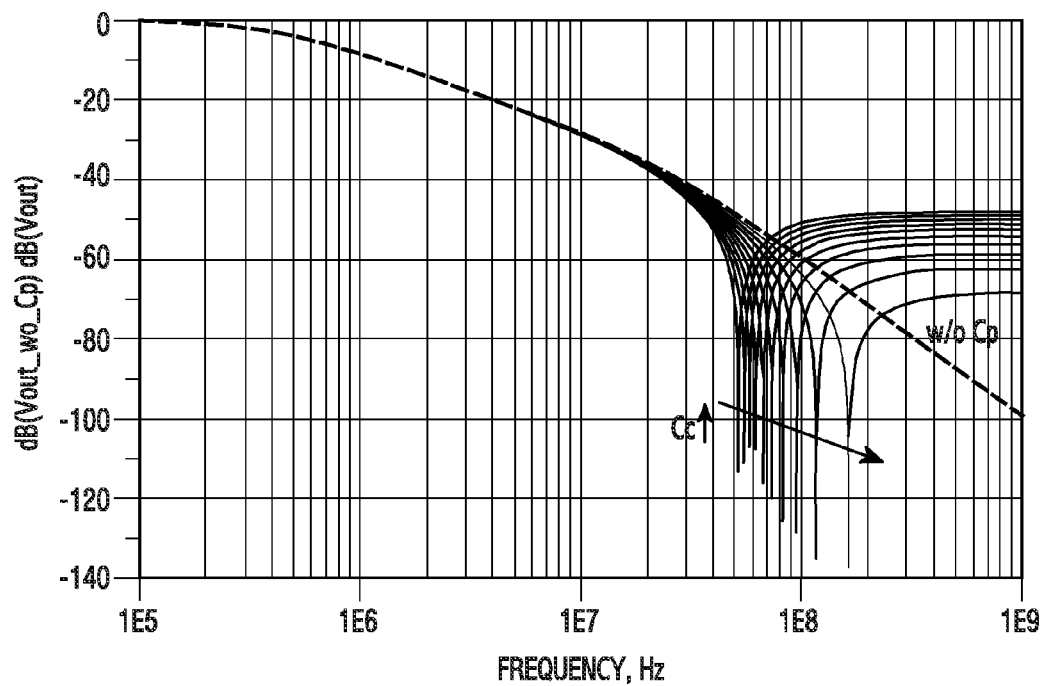

Referring to FIG. 9B, the compensation capacitance is changed with the anti-phase of the switching noise. In the anti-phase, as the compensation capacitance increases, the compensation capacitance can cancel the parasitic capacitance and thus the resonance point rises. That is, the noise of the high frequency band can be suppressed. When the compensation capacitance is equal to the parasitic capacitance, the resonance point disappears and thus the influence of the parasitic capacitance is removed.

FIG. 10 illustrates output voltage waveform simulation results with switching noise removed according to an embodiment of the present disclosure.

Figure 10A:
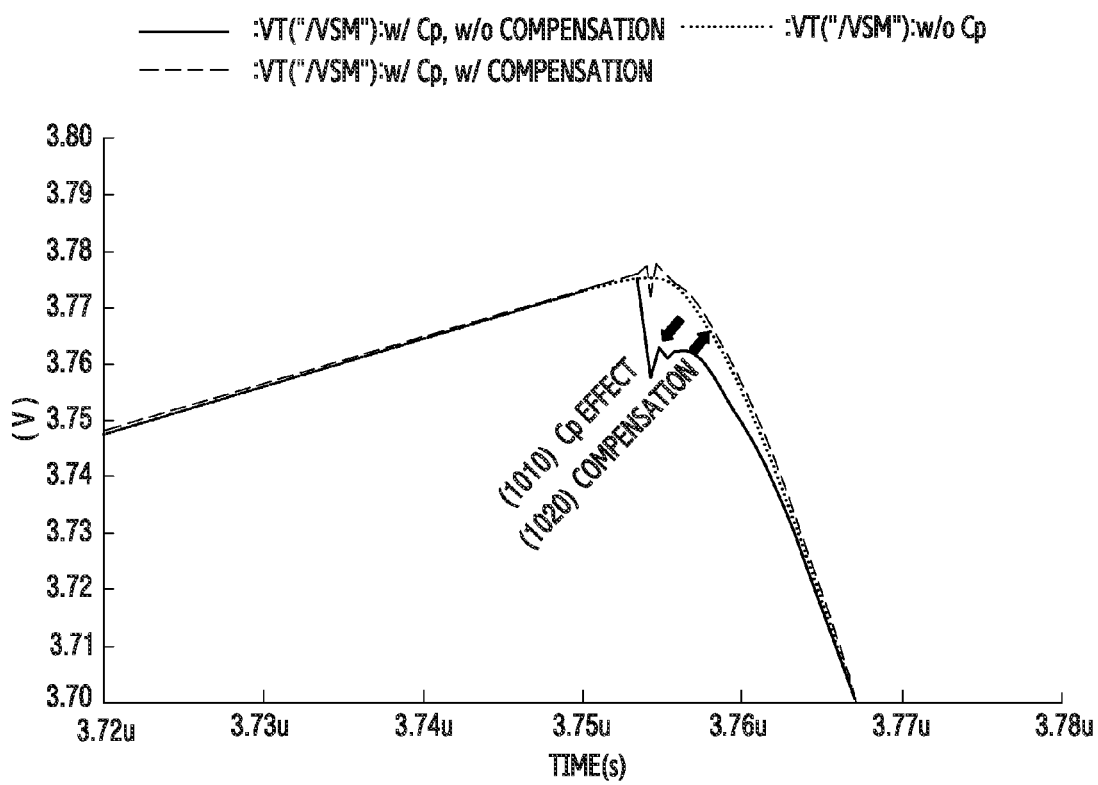
FIGS. 10A and 10B illustrate output voltage waveform simulation results with switching noise removed according to an embodiment of the present disclosure.
Figure 10B:
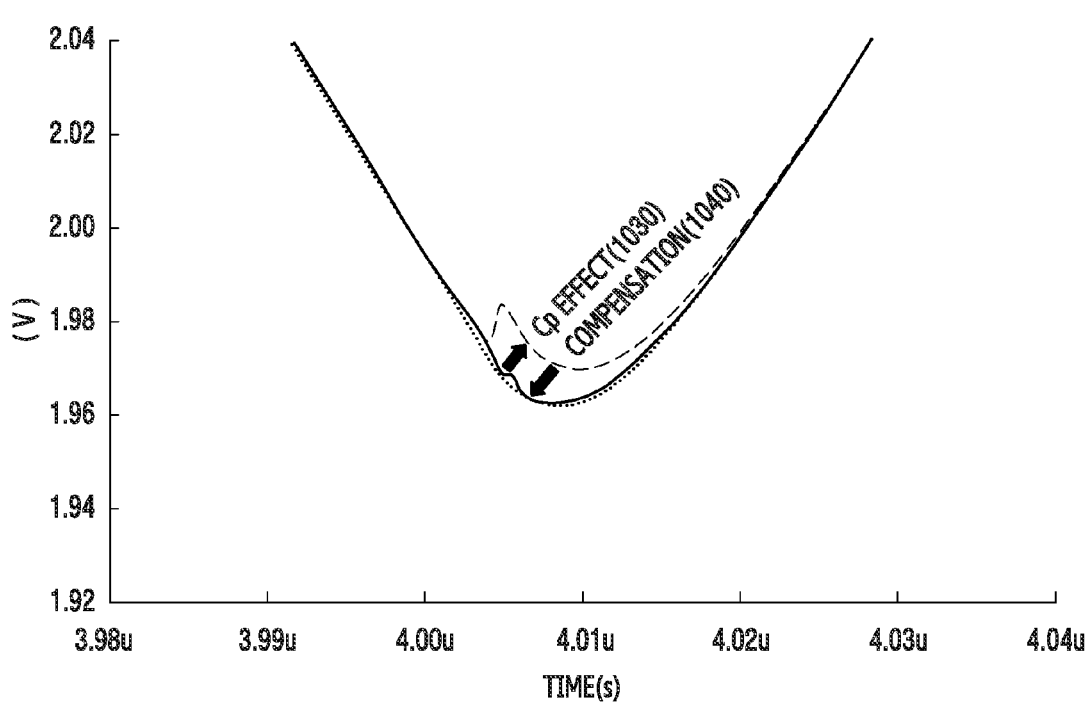

Referring to FIG. 10A, the voltage rises and falls. In FIG. 10B, the voltage falls and rises. When the power inductor has the parasitic capacitor compared to the ideal case, the switching noise affects the output waveform and thus affects the voltage through Cp effects 1010 and 1030 at the point of the switching. Using the present compensation circuit, the compensation 1020 and 1040 can almost remove the output switching noise and thus restore an ideal voltage waveform.

Figure 11:
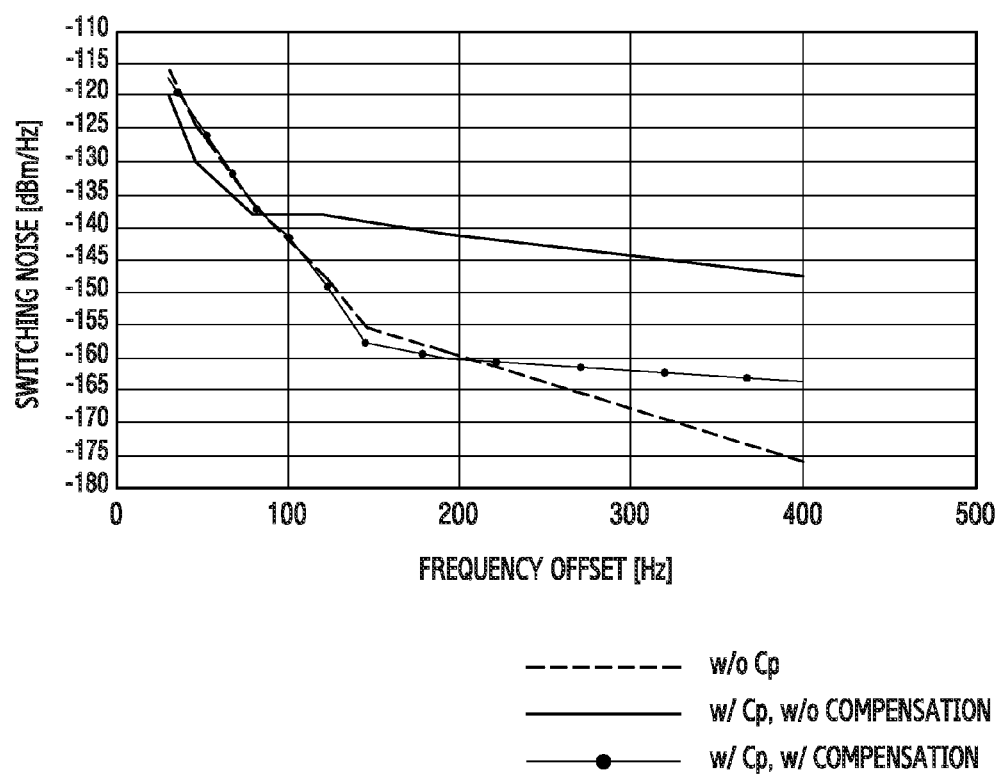
FIG. 11 illustrates output noise Power Spectrum Density (PSD) simulation results with switching noise removed according to an embodiment of the present disclosure.

FIG. 11 illustrates output noise Power Spectrum Density (PSD) simulation results with switching noise removed according to an embodiment of the present disclosure.

Fast Fourier Transform (FFT) is applied to the voltage waveform of FIG. 10 and the PSD is simulated in the frequency domain. As a result, when the power inductor includes the parasitic capacitor, the switching noise of 30~40 dB is added after the resonance point. When the compensation circuit is applied, a little noise remains in a very high frequency but the effect over 30 dB or so can be exhibited in every frequency. The simulation of FIG. 11 can obtain the effect over 10 dB or so even with a mismatch about 10 deg and +−0.5 pF. Accordingly, the present transmitter is insensitive to a Process Voltage and Temperature (PVT) change in the chip and effectively cancels the noise.

The methods as described in the claims and/or the specification of various embodiments of the present disclosure can be implemented using hardware, software, or a combination of them.

As for the software, a non-transitory computer-readable storage medium storing one or more programs (software modules) may be provided. One or more programs stored in the non-transitory computer-readable storage medium may be configured for execution by one or more processors of a server or the electronic apparatus. One or more programs include instructions for controlling the electronic apparatus to execute the methods according to the various embodiments as described in the claims and/or the specification of the present disclosure.

Such a program (software module, software) may be stored to a random access memory, a non-volatile memory including a flash memory, a Read Only Memory (ROM), an Electrically Erasable Programmable ROM (EEPROM), a magnetic disc storage device, a Compact Disc (CD)-ROM, Digital Versatile Discs (DVDs) or other optical storage devices, and a magnetic cassette. Alternatively, the programs may be stored to a memory combining part or all of those recording media. A plurality of memories may be equipped.

The programs may be stored in an attachable storage device accessible via a communication network such as Internet, Intranet, Local Area Network (LAN), Wide LAN (WLAN), or Storage Area Network (SAN), or a communication network by combining these networks. The storage device can access the electronic apparatus through an external port. A separate storage device may access a portable electronic apparatus over a communication network.

As set forth above, by effectively removing noise of a particular frequency band through the present noise cancelling circuit using an additional capacitor of the in-phase or the anti-phase with the parasitic capacitor, it is possible to produce the very low switching noise in the output and to prevent the reception degradation due to the noise of the SM in the envelope tracking power amplifier. In addition, a single inductor, rather than a plurality of inductors, can reduce the area and the cost.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A device comprising:
   a supply modulator configured to:
      generate a switching signal comprising a compensation signal for switching noise generated via switching amplification based on a linear signal, wherein the linear signal is generated by amplifying an input envelope signal, and
      generate an output envelope signal by summing the switching signal and the linear signal; and
   a power amplifier configured to generate an output signal by amplifying the output envelope signal.

2. The device of claim 1, further comprising:
   a baseband signal processor configured to detect the input envelope signal.

3. The device of claim 1, wherein the supply modulator comprises:
   a linear amplifier configured to generate the linear signal by amplifying the input envelope signal; and
   a switching amplifier configured to generate the switching signal.

4. The device of claim 1, wherein the supply modulator comprises a circuit for generating the compensation signal, and
   wherein the circuit comprises at least one a first element operating as a switch, a second element operating as an inverter, and a third element operating as a capacitor.

5. The device of claim 4, wherein the supply modulator comprises a forth element operating a power inductor, and
   wherein the circuit is connected to the forth element in parallel.

6. The device of claim 4, wherein the second element generates an anti-phase signal for the switching noise.

7. The device of claim 5, wherein the third element has a compensation capacitance corresponding to a parasitic capacitance value for the forth element.

8. The device of claim 1, wherein the compensation signal comprises a signal for compensating for a noise signal of the switching signal.

9. The device of claim 1, wherein the compensation signal comprises an in-phase signal for the switching signal, if a value for a frequency band for the input envelope signal is lower than a predetermined threshold.

10. The device of claim 1, wherein the compensation signal comprises an anti-phase signal for the switching signal, if a value for a frequency band for the input envelope signal is greater than a predetermined threshold.

11. The device of claim 1, wherein the supply modulator comprises a circuit for generating the compensation signal, and
    wherein the circuit comprises a plurality of inverters and a plurality of capacitors.

12. The device of claim 11, wherein the circuit comprises a plurality of path switches for building a path to generate the compensation signal through one of the inverters and one of the capacitors, and
    wherein each of the path switches is operated according to a calibration signal.

13. The device of claim 12, wherein the calibration signal is at least one a predetermined signal stored in the device, a signal received from another device, and a signal generated in the circuit.

14. A method for operating a device, the method comprising:
    generating a switching signal comprising a compensation signal for switching noise generated via switching amplification based on a linear signal, wherein the linear signal is generated by amplifying an input envelope signal;
    generating an output envelope signal by summing the linear signal and the switching signal; and
    generating an output signal by amplifying the output envelope signal.

15. The method of claim 14, further comprising:
    detecting the input envelope signal.

16. The method of claim 14, further comprising:
    generating the linear signal by amplifying the input envelope signal.

17. The method of claim 14, wherein the compensation signal is generated by a circuit included in the device, and
    wherein the circuit comprises at least one a first element operating as a switch, a second element operating as an inverter, and a third element operating as a capacitor.

18. The method of claim 17, wherein a forth element operating as a power inductor is included in the device, and
    wherein the circuit is connected to the forth element in parallel.

19. The method of claim 17, wherein the second element an anti-phase signal for the switching noise.

20. The method of claim 18, wherein the third element has a compensation capacitance corresponding to a parasitic capacitance value for the forth element.

21. The method of claim 14, wherein the compensation signal comprises a signal for compensating for a noise signal of the switching signal.

22. The method of claim 14, wherein the compensation signal comprises an in-phase signal for the switching signal, if a value for a frequency band for the input envelope signal is lower than a predetermined threshold.

23. The method of claim 14, wherein the compensation signal comprises an anti-phase signal for the switching signal, if a value for a frequency band for the input envelope signal is greater than a predetermined threshold.

24. The method of claim 14, wherein compensation signal is generated by a circuit included in the device, and
    wherein the circuit comprises a plurality of inverters and a plurality of capacitors.

25. The method of claim 24, wherein the circuit comprises a plurality of path switches for building a path to generate the compensation signal through one of the inverters and one of the capacitors, and
    wherein each of the path switches is operated according to a calibration signal.

26. The method of claim 25, wherein the calibration signal is at least one a predetermined signal stored in the device, a signal received from another device, and a signal generated in the circuit.

* * * * *